(12) United States Patent
Yu et al.

(10) Patent No.: US 7,648,921 B2
(45) Date of Patent: Jan. 19, 2010

(54) METHOD OF FORMING DIELECTRIC LAYER

(75) Inventors: Hsu-Sheng Yu, Hsinchu (TW); Shing-Ann Lo, Hsinchu (TW); Ta-Hung Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 320 days.

(21) Appl. No.: 11/534,583

(22) Filed: Sep. 22, 2006

(65) Prior Publication Data
US 2008/0124940 A1    May 29, 2008

(51) Int. Cl.
*H01L 21/469* (2006.01)

(52) U.S. Cl. ............ 438/758; 438/762; 438/788; 438/637; 438/424; 438/425; 438/619; 438/435; 438/428; 438/433; 438/436; 257/E23.013; 257/E21.564; 257/E21.553; 257/E21.597; 257/E21.548; 257/E21.55; 257/E21.549

(58) Field of Classification Search ............ 438/758
See application file for complete search history.

(56) References Cited

U.S. PATENT DOCUMENTS

| | | | | |
|---|---|---|---|---|
| 5,278,103 A * | 1/1994 | Mallon et al. | ............ | 438/632 |
| 5,747,382 A * | 5/1998 | Huang et al. | ............ | 438/624 |
| 5,773,361 A * | 6/1998 | Cronin et al. | ............ | 438/637 |
| 5,827,782 A | 10/1998 | Shih | | |
| 5,872,401 A * | 2/1999 | Huff et al. | ............ | 257/758 |
| 5,897,370 A * | 4/1999 | Joshi et al. | ............ | 438/632 |
| 5,968,610 A * | 10/1999 | Liu et al. | ............ | 438/435 |
| 6,136,687 A * | 10/2000 | Lee et al. | ............ | 438/624 |
| 6,153,937 A * | 11/2000 | Irie et al. | ............ | 257/775 |
| 6,159,845 A * | 12/2000 | Yew et al. | ............ | 438/637 |
| 6,174,808 B1 * | 1/2001 | Jang et al. | ............ | 438/680 |
| 6,203,863 B1 * | 3/2001 | Liu et al. | ............ | 427/579 |
| 6,255,162 B1 * | 7/2001 | Tsai et al. | ............ | 438/257 |
| 6,265,269 B1 * | 7/2001 | Chen et al. | ............ | 438/270 |
| 6,335,261 B1 * | 1/2002 | Natzle et al. | ............ | 438/435 |
| 6,337,282 B2 * | 1/2002 | Kim et al. | ............ | 438/699 |
| 6,399,476 B2 * | 6/2002 | Kim et al. | ............ | 438/619 |
| 6,410,446 B1 * | 6/2002 | Tsai et al. | ............ | 438/695 |
| 6,423,630 B1 * | 7/2002 | Catabay et al. | ............ | 438/624 |
| 6,451,669 B2 * | 9/2002 | Torres et al. | ............ | 438/409 |
| 6,544,861 B2 * | 4/2003 | Joo | ............ | 438/424 |
| 6,583,069 B1 * | 6/2003 | Vassiliev et al. | ............ | 438/778 |
| 6,627,514 B1 * | 9/2003 | Park et al. | ............ | 438/435 |
| 6,645,859 B1 * | 11/2003 | Sawada et al. | ............ | 438/680 |
| 6,746,936 B1 * | 6/2004 | Lee | ............ | 438/445 |
| 6,767,837 B2 | 7/2004 | Sun et al. | | |
| 6,802,944 B2 * | 10/2004 | Ahmad et al. | ............ | 204/192.23 |
| 6,812,115 B2 * | 11/2004 | Wieczorek et al. | ............ | 438/424 |
| 6,855,617 B1 * | 2/2005 | Lu et al. | ............ | 438/435 |
| 6,887,766 B2 * | 5/2005 | Koh | ............ | 438/421 |
| 6,946,359 B2 * | 9/2005 | Yang et al. | ............ | 438/425 |
| 6,982,207 B2 | 1/2006 | Bai et al. | | |

(Continued)

*Primary Examiner*—Fernando L Toledo
*Assistant Examiner*—Ankush K Singal
(74) *Attorney, Agent, or Firm*—J.C. Patents

(57) ABSTRACT

A method of forming a dielectric layer is provided. A first dielectric layer is formed on a substrate having metal layers formed thereon. The first dielectric layer includes overhangs in the spaces between two neighboring metal layers and voids under the overhangs. The first dielectric layer is partially removed to cut off the overhangs and expose the voids and therefore openings are formed. A second dielectric layer is formed on the dielectric layer to fill up the opening.

12 Claims, 3 Drawing Sheets

U.S. PATENT DOCUMENTS

| | | | |
|---|---|---|---|
| 7,078,313 B2 * | 7/2006 | Kirchhoff | 438/425 |
| 7,122,416 B2 * | 10/2006 | Nevin et al. | 438/221 |
| 7,196,021 B2 * | 3/2007 | Tan et al. | 438/788 |
| 7,223,701 B2 * | 5/2007 | Min et al. | 438/714 |
| 7,235,865 B2 * | 6/2007 | Juengling | 257/635 |
| 7,268,057 B2 * | 9/2007 | Ryan et al. | 438/427 |
| 7,344,996 B1 * | 3/2008 | Lang et al. | 438/723 |
| 2003/0054630 A1 * | 3/2003 | Kirchhoff | 438/624 |
| 2003/0143852 A1 * | 7/2003 | En-Ho et al. | 438/694 |
| 2003/0207580 A1 * | 11/2003 | Li et al. | 438/700 |
| 2004/0161919 A1 * | 8/2004 | Cha et al. | 438/618 |
| 2004/0169282 A1 * | 9/2004 | Koh | 257/758 |
| 2004/0241956 A1 * | 12/2004 | Eun et al. | 438/424 |
| 2006/0145287 A1 * | 7/2006 | Kim | 257/510 |
| 2007/0059900 A1 * | 3/2007 | Lai et al. | 438/435 |
| 2007/0264790 A1 * | 11/2007 | Cho et al. | 438/424 |

* cited by examiner

METHOD OF FORMING DIELECTRIC LAYER

BACKGROUND OF THE INVENTION

1. Field of the Invention

The present invention relates to a method of forming a material layer for semiconductor manufacturing process, and more particularly, to a method of forming a dielectric layer for semiconductor manufacturing process.

2. Description of Related Art

Dielectric layers play an important role in semiconductor manufacturing process as they can isolate adjacent devices or metal lines from short circuit. In the conventional metal interconnection manufacturing process, the dielectric layer is deposited on the semiconductor substrate after the metal lines are formed. The plasma enhanced CVD (PECVD) is conventionally used for forming the dielectric layer. However, as semiconductor manufacturing process has come into the stage of deep sub-micron technology, the distance between metal lines shrinks considerably; thus, the conventional PECVD is no longer applicable for filling the dielectric layer into the gaps between the metal lines. Therefore, a High density Plasma Chemical Vapor Deposition (HDPCVD) process has been newly developed.

HDPCVD process has been widely applied in the field because it has the advantages such as good gap-filling capability, high quality of thin film and less metal contamination. HDPCVD process utilizes a high-efficiency plasma generator, such as Inductive Coupled Plasma (ICP), Electron Cyclotron Resonance (ECR) or helicon wave to generate high density plasma reactive source. In addition, a separate RF bias power supply can be applied to the wafer, such that the positive ions of the plasma will bombard the deposited film surface, thereby having the effect of eliminating voids and/or seams.

Along with the minimization of devices, the gaps between the metal lines become smaller and smaller while the aspect ratios thereof are higher and higher; thus, overhangs may be formed in the spaces between metal lines when HDPCVD process is applied. Voids may be formed when two adjacent overhangs are very close, such that the spaces between the metal lines can not be completely filled by the dielectric layer.

SUMMARY OF THE INVENTION

The invention provides a method of forming a void-less dielectric layer.

The present invention provides a method of forming a dielectric layer. A first dielectric layer is formed on the substrate. The first dielectric layer covers a plurality of protruding structures disposed on the substrate, and the first dielectric layer located in the spaces between the protruding structures includes two adjacent overhangs; and voids are formed under the overhangs. Next, a part of the first dielectric layer is removed with at least cutting off the overhangs to expose the voids, so as to form openings. Then, a second dielectric layer is formed on the substrate to cover the first dielectric layer and fill up the openings.

According to one embodiment of the present invention, the method of forming the aforementioned first dielectric layer and the second dielectric layer includes performing an HDPCVD process. The material of the first and second dielectric layers includes silicon oxide.

According to one embodiment of the present invention, before forming the first dielectric layer, a liner layer may be formed over the substrate to cover the protruding structures. The liner layer includes silicon-oxy-nitride layer or silicon-rich oxide (SRO) layer, and the forming method includes CVD.

According to one embodiment of the present invention, the step of removing a part of the first dielectric layer includes performing an etch-back process, for example, an anisotropic etching process. The anisotropic etching process includes using an RF bias to perform ion bombardment. The gas source includes fluorine-containing gas.

According to one embodiment of the present invention, the protruding structures include metal layers.

In the present invention, two-stage or multi-stage deposition and an etch process are used to form the dielectric layer. The etch process can eliminate the overhangs of the first-time deposited dielectric layer, so as to make the void underneath become an opening that can be filled up by the subsequent deposited dielectric layer. As a result, the formed dielectric layer does not comprise any voids.

It is to be understood that both the foregoing general description and the following detailed description are exemplary, and are intended to provide further explanation of the invention as claimed.

DESCRIPTION OF EMBODIMENTS

According to the present invention, two-stage or multi-stage deposition processes are used to form the dielectric layers, and an etch process is performed between each deposition process. The etch process can eliminate the overhangs of the deposited dielectric layer so that the void underneath becomes an opening, and the subsequent deposition process of the second dielectric layer fills up the opening; therefore, the present invention provides a method of forming a void-less dielectric layer.

The following are detailed descriptions of the embodiments of the present invention.

Figure 1A:
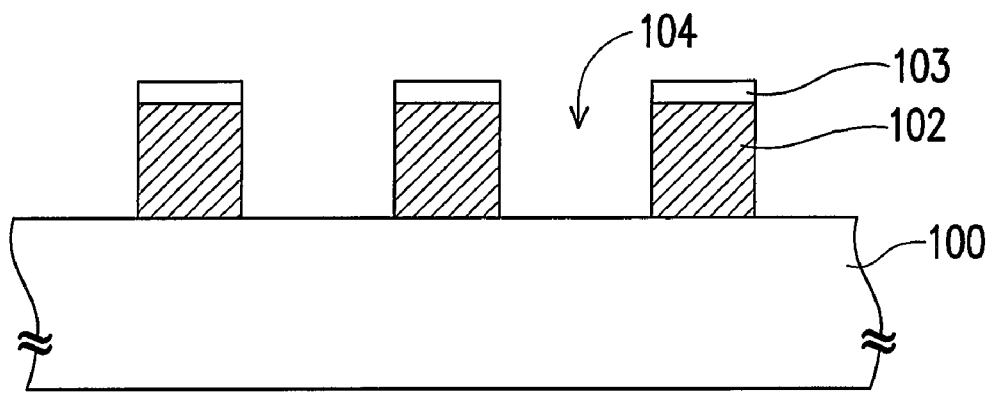
FIGS. 1A through 1D are schematic, cross-sectional views showing the step for forming the dielectric layer according to one embodiment of the invention.
Figure 1B:
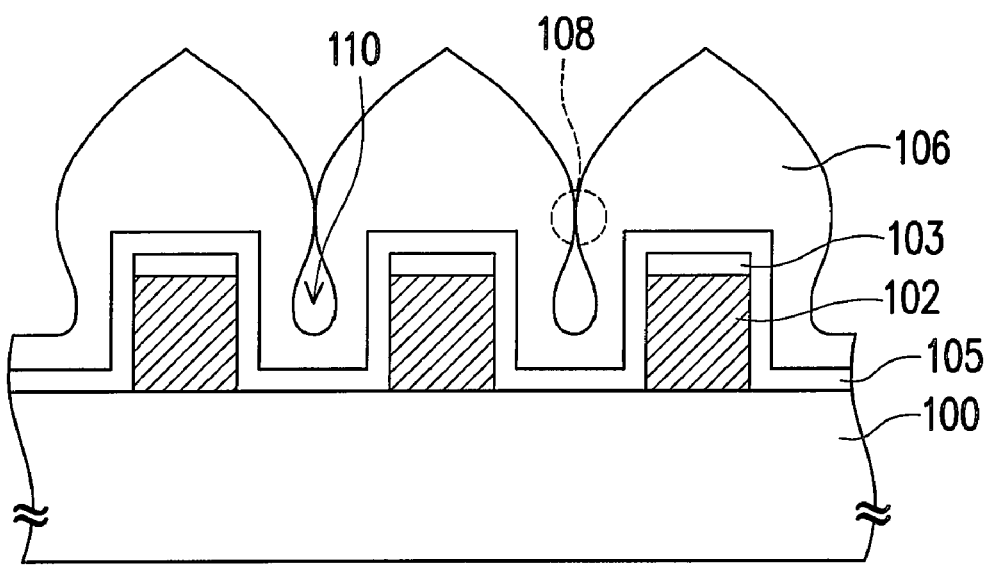
Figure 1C:
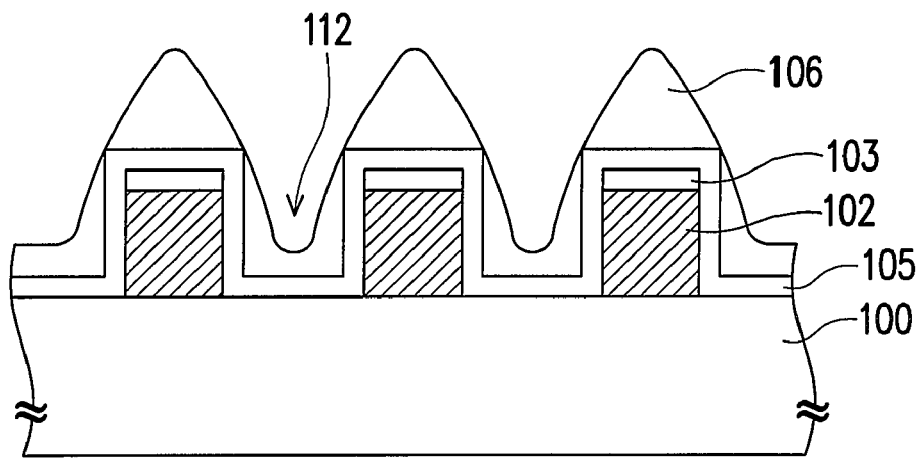

FIGS. 1A through 1C are schematic, cross-sectional views showing the step for forming the dielectric layer according to one embodiment of the invention.

Referring to FIG. 1A, a substrate 100 having a plurality of protruding structures 102 is provided. The protruding structures 102 are, for example, a metal layer such as metal lines, and an anti-reflective layer 103 is formed on the surface of the protruding structures. Next, referring to FIG. 1B, a dielectric layer 106 is formed on the substrate 100, and the dielectric 106 covers the protruding structures 102 of the substrate 100. Generally, the narrower the gap 104 is, the more serious the formation of the overhangs 108 between the gaps 104 of the dielectric layer 106 is. When two adjacent overhangs are very close to each other, a void 110 will be formed under the overhangs 108. The material of the dielectric layer 106 is, for example, silicon oxide, and the forming method can be a high density plasma chemical vapor deposition (HDPCVD) process. The deposition thickness of the dielectric layer 106 varies along with the size of the gaps 104. A preferable thickness of the dielectric layer 106 is to stop depositing the dielectric layer 106 when the adjacent overhangs 108 are just, or are going to be, in contact with each other, thereby avoiding the time and cost for removing the overhangs in the subsequent etch process.

Generally, a liner layer 105 will be formed on the substrate 100 before forming the dielectric layer 106 to prevent forming impurity during the deposition process or exposing devices under UV light in the environment. The liner layer 105 includes silicon-oxy-nitrude layer or silicon-rich oxide (SRO) layer, and the forming method includes CVD. As a result, the gap 104 between the protruding structures 102 becomes narrower, and it is harder for the subsequent dielectric layer 106 to fill up the gap 104. In other words, the problem of the overhangs 108 and the voids 110 is worsened.

Referring to FIG. 1C, openings 112 are formed by removing a part of the dielectric layer 106, cutting off the overhangs 108 and exposing the voids 110. The step of removing the part of the dielectric layer 106 includes performing an etch-back process, for example, an anisotropic etching process. The anisotropic etching process includes applying an RF bias to bombard ions so as to effectively eliminate the overhangs 108. In one embodiment, referring to FIG. 1E, the etch process not only eliminates the overhangs 108 but also removes the liner layer 105 underneath; therefore, the opening 112 is wider. The gas source for the etch process includes fluorine-containing gas, such as $SF_6$, or fluoroolefin compound, for example, $CF_4$, $CHF_3$ or $C_4F_8$.

Figure 1D:
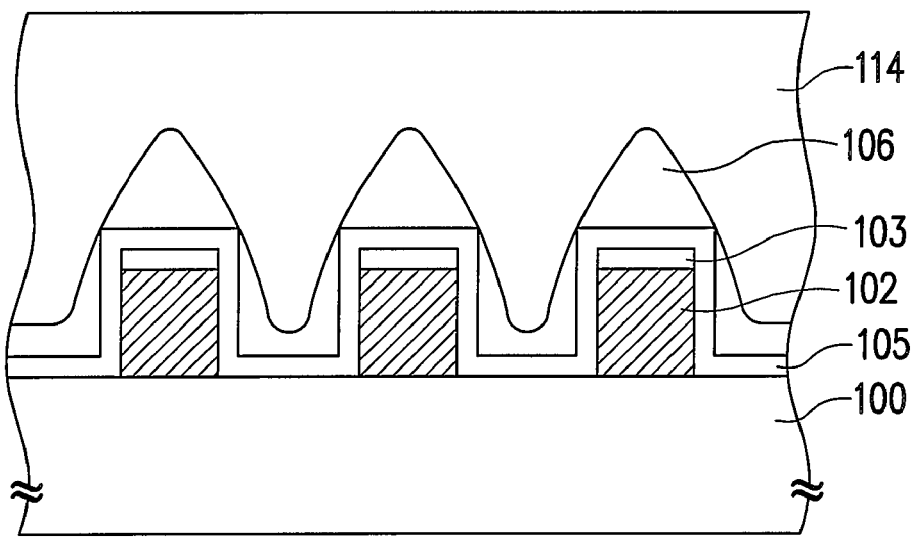
Figure 1E:
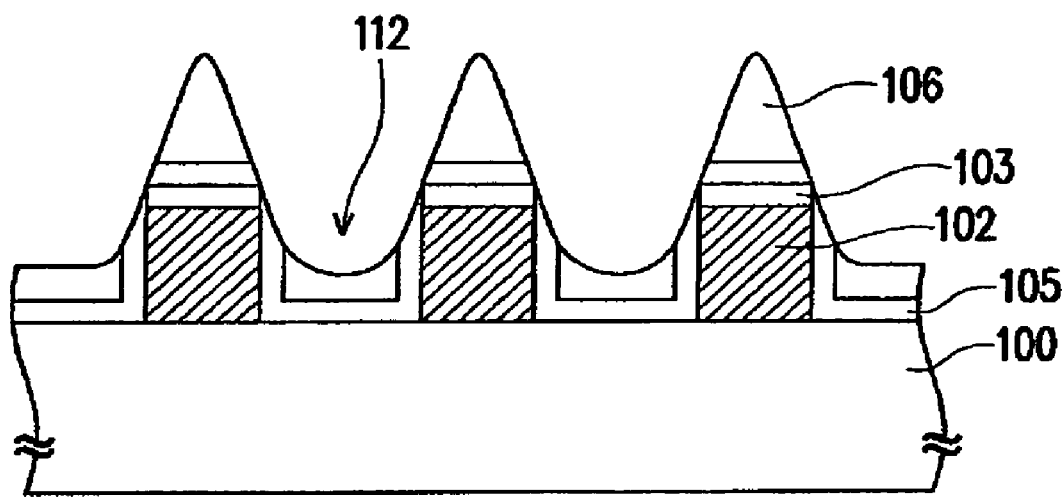
FIG. 1E is a schematic, cross-sectional view showing the step for forming the dielectric layer according to another embodiment of the invention.

Next, referring to FIG. 1D, a dielectric layer 114 is formed on the substrate 100. Since the tops of the openings 112 are wide openings and the aspect ratio is smaller than that of the spaces 104 prior to the formation of the dielectric layer 106, therefore, the dielectric layer 114 not only covers the dielectric 106 but also fills up the openings 112 without having any voids. The material of the dielectric layer 114 is, for example, silicon oxide, and the forming method can be an HDPCVD process.

As the devices are minimized, the gap between the protruding structures becomes smaller and smaller while the aspect ratio of the protruding structures is higher and higher. If there is still the problem that the overhangs are unable to be filled up by the second deposited dielectric layer, an etch process can be further performed to remove the overhangs, and then another dielectric layer can be formed. The etch method and the material and the deposition of the third-stage dielectric layer can be referred to the description mentioned above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dielectric layer, comprising:
providing a substrate, on which a plurality of protruding structures is formed, and a space is between two of the adjacent protruding structures;
forming a liner layer on the substrate and the plurality of protruding structures;
forming a first dielectric layer on the substrate, wherein the first dielectric layer located in the spaces comprises two adjacent overhangs and voids are formed under the overhangs below a top surface of each of the plurality of the protruding structures; and
performing an etch-back process to remove a part of the first dielectric layer and a part of the liner layer to at least cutting off the overhangs, and exposing the voids and widening the voids, so as to form a plurality of openings
forming a second dielectric layer on the substrate by performing an HDP-CVD process to cover the first dielectric layer and fill up the openings.

2. The method of forming dielectric layer as claimed in claim 1, wherein the method of forming the first dielectric layer comprises performing an HDP-CVD process.

3. The method of forming the dielectric layer as claimed in claim 1, wherein the method of forming the second dielectric layer comprises performing an HDP-CVD process.

4. The method of forming the dielectric layer as claimed in claim 1, wherein the liner layer comprises silicon-oxy-nitride layer or silicon-rich oxide layer.

5. The method of forming the dielectric layer as claimed claim 1, wherein the first dielectric layer comprises a silicon oxide layer.

6. The method of forming the dielectric layer as claimed claim 1, wherein the second dielectric layer comprises a silicon oxide layer.

7. The method of forming the dielectric layer as claimed in claim 1, wherein the step of removing the first dielectric layer includes performing an anisotropic etching process.

8. The method of forming the dielectric layer as claimed in claim 1, wherein the protruding structures comprise metal layers.

9. The method of forming the dielectric layer as claimed in claim 4, wherein the method of forming the liner layer comprises chemical vapor deposition.

10. The method of forming the dielectric layer as claimed in claim 7, wherein the etch-back process comprises performing an anisotropic etching process.

11. The method of forming the dielectric layer as claimed in claim 10, the anisotropic etching process includes applying an RF bias, so as to make ions bombard the overhangs.

12. The method of forming the dielectric layer as claimed in claim 10, gas source for the anisotropic etching process includes fluorine-containing gas.

* * * * *